United States Patent
Pu

(10) Patent No.: US 7,057,405 B2
(45) Date of Patent: Jun. 6, 2006

(54) WAFER TEST METHOD UTILIZING CONDUCTIVE INTERPOSER

(75) Inventor: Han-Ping Pu, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/757,241

(22) Filed: Jan. 14, 2004

(65) Prior Publication Data

US 2005/0007129 A1    Jan. 13, 2005

(30) Foreign Application Priority Data

Jul. 10, 2003    (TW) .............................. 92118810 A

(51) Int. Cl.
*G01R 31/02*    (2006.01)
(52) U.S. Cl. ...................... 324/754; 324/761
(58) Field of Classification Search ........ 324/754–758, 324/761–762, 765; 439/66–67, 482; 29/829, 29/837, 840–841
See application file for complete search history.

(56) References Cited

U.S. PATENT DOCUMENTS

| | | | | |
|---|---|---|---|---|
| 5,374,893 A | * | 12/1994 | Koopman et al. ........... | 324/754 |
| 5,559,446 A | * | 9/1996 | Sano ........................... | 324/760 |
| 5,703,494 A | * | 12/1997 | Sano ........................... | 324/761 |
| 5,759,047 A | * | 6/1998 | Brodsky et al. .............. | 439/66 |
| 5,786,701 A | * | 7/1998 | Pedder ........................ | 324/754 |
| 6,614,246 B1 | * | 9/2003 | Kohno et al. ................ | 324/754 |

* cited by examiner

*Primary Examiner*—Minh N. Tang
(74) *Attorney, Agent, or Firm*—Peter F. Corless; Steven M. Jensen; Edwards Angell Palmer & Dodge, LLP

(57) ABSTRACT

A wafer test method is performed for a wafer prior to forming bumps on the wafer, using a conductive interposer having one side with test pads and the other side with test bumps electrically connected to the test pads. The conductive interposer is mounted on the wafer having a plurality of chips, wherein the test bumps are in electrical contact with bond pads on active surfaces of the chips. Test probes are used to contact the test pads to perform tests for the chips. This wafer test method is beneficially performed prior to forming bumps on the wafer, such that the prior-art drawback of damaging bumps on the wafer by contacting test probes with the bumps on the wafer can be eliminated, and the conductive interposer mounted on the wafer prevents the test probes from physical contact with the bond pads on the chips, thereby not damaging the bond pads.

13 Claims, 5 Drawing Sheets

WAFER TEST METHOD UTILIZING CONDUCTIVE INTERPOSER

FIELD OF THE INVENTION

The present invention relates to wafer test methods, and more particularly, to a method for testing a wafer performed prior to forming bumps on the wafer.

BACKGROUND OF THE INVENTION

Semiconductor package is a resin-encapsulated structure incorporated with at least one integrated circuit component such as semiconductor chip that is enclosed by an encapsulating resin for protection. A chip carrier (e.g. substrate, lead frame, etc.) is usually employed to mount and electrically connect the semiconductor chip. A conventional electrical connection is achieved by using a plurality of conductive bonding wires (such as gold wires) to interconnect an active surface of the chip and the chip carrier, and the bonding wires are also encapsulated by the encapsulating resin. However, the bonding wires possess predetermined length and loop height, such that they occupy a certain extent of surface area on the chip carrier; further, an encapsulation body formed by the encapsulating resin is required having a height larger than the loop height to completely enclose the bonding wires and prevent the bonding wires from exposure that may damage the electrical performance of the bonding wires, such that the package size is hardly reduced. Accordingly, a flip-chip package is developed, characterized in pre-forming a plurality of bumps on the active surface of the chip for electrical connection, and allowing the chip to be mounted on and electrically connected to the chip carrier by the bumps. Unlike the bonding wires, the use of bumps, not having the concern of length and loop height, can effectively reduce the package size.

During fabrication of a flip chip, normally when a wafer comprising a plurality of chips is fabricated, a bumping process is performed using conventional screen printing technology to deposit tin-lead alloy at bond pads formed on active surfaces of the chips, and the tin-lead alloy is reflowed to form bumps. Then, the chips of the wafer are required subject to electrical tests to examine the quality and functionality of the chips, so as to figure out inferior chips having defective quality and functions. After the wafer undergoes a singulation process to separate apart the chips, the inferior chips are discarded, only allowing the chips passing the tests to be subject to subsequent fabrication processes.

The above electrical tests can be performed before and after forming the bumps on the wafer; the former is shown in FIGS. 6A and 6B. In FIG. 6A, test probes 2 directly contact bond pads 13 formed on the wafer 1 to perform the tests. In FIG. 6B, after the tests, a UBM (under bump metallurgy) structure 15 is formed respectively on the bond pads 13 to allow a bump 14 to be formed on each UBM structure 15. However, this test method undesirably causes a notch on or damage to the bond pads 13 (FIG. 6A) or the UBM structure 15 by direct contact of the test probes 2. When the notched UBM structure 15 is connected with the bump 14, a void trapped with air would form at the notch and easily leads to popcorn effect thereby degrading the reliability of fabricated products.

Therefore, the more commonly used method is to perform the tests after the bumping process; as shown in FIG. 6C, the test probes 2 directly contact the bumps 14 on the wafer to carry out the electrical tests on the chips 10. However, this method easily damages the bumps 14 and thus affects yield of subsequent chip packaging.

Moreover, U.S. Pat. No. 6,429,532 discloses a special arrangement of bond pads including a plurality of test bond pads that are electrically connected to bond pads formed with bumps, such that test probes contact the test bond pads to perform tests. However, this bond-pad arrangement requires additional surface area on the wafer for disposing the test bond pads, thereby not favorable for size miniaturization.

In addition, U.S. Pat. No. 5,661,042 discloses the use of an anisotropic conductive film (ACF) as a conductive medium between the wafer and the test probes, to allow an electrical current to flow through the ACF for performing the wafer tests. However, this technology is defective that the ACF has high conductive resistance and is only suitable for mediating the current but not for test performance; further, the ACF has short contact lifetime (about 50 times) and cannot be used repeatedly, and the ACF is expensively fabricated, thereby undesirably increasing the fabrication costs.

Therefore, the problem to be solved herein is to provide a wafer test method carried out before forming bumps on the wafer, which would not damage bond pads on the wafer and not increase fabrication costs.

SUMMARY OF THE INVENTION

An objective of the present invention is to provide a wafer test method by which a conductive interposer is mounted on a wafer before forming bumps on the wafer, to allow test probes to contact the conductive interposer and perform tests for the wafer.

Another objective of the invention is to provide a wafer test method by which the conductive interposer mounted on the wafer for performing the wafer tests would not damage bond pads on the wafer.

A further objective of the invention is to provide a wafer test method by which the conductive interposer mounted on the wafer for performing the wafer tests is cost-effectively fabricated and can be used repeatedly, thereby not requiring the use of an expensive anisotropic conductive film (ACF) and not increasing the fabrication costs.

In accordance with the foregoing and other objectives, the present invention proposes a wafer test method, comprising the steps of: providing a wafer integrally formed of a plurality of chips, each of the chips having an active surface and an opposite inactive surface, with a plurality of bond pads formed on the active surface; preparing a conductive interposer having a first surface and an opposite second surface, wherein the first surface is formed with a plurality of test pads, and the second surface is formed with a plurality of test bumps electrically connected to the test pads, the test bumps corresponding to the bond pads of the chips, and mounting the conductive interposer on the wafer such that the test bumps are in electrical contact with the bond pads to electrically connect the conductive interposer to the chips; and using test probes to contact the test pads of the conductive interposer to perform tests for the chips of the wafer.

Therefore, the wafer test method according to the invention is carried out for a fabricated wafer prior to forming bumps on the wafer, using a conductive interposer having one side with test pads and the other side with test bumps electrically connected to the test pads. The conductive interposer is mounted on the wafer comprising a plurality of chips, wherein the test bumps are in electrical contact with bond pads formed on active surfaces of the chips. Then, test probes are used to contact the test pads to perform tests for the chips. This wafer test method is beneficially performed prior to forming bumps on the wafer, such that the prior-art drawback of damaging bumps on the wafer by contacting test probes with the bumps on the wafer can be eliminated, and the conductive interposer mounted on the wafer prevents the test probes from physical contact with the bond pads on the chips, thereby not causing damage to the bond pads. Moreover, compared to the prior art using test probes to directly contact bond pads on the wafer, the use of the conductive interposer according to the invention allows moderate contact and increase in contact area between the conductive interposer and the bond pads on the wafer, such that the wafer tests can be more accurately and precisely performed. In addition, compared to using an expensive anisotropic conductive film (ACF) having high resistance and short contact lifetime, the conductive interposer according to the invention is more cost-effectively fabricated and can be used repeatedly, thereby reducing the overall fabrication costs.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
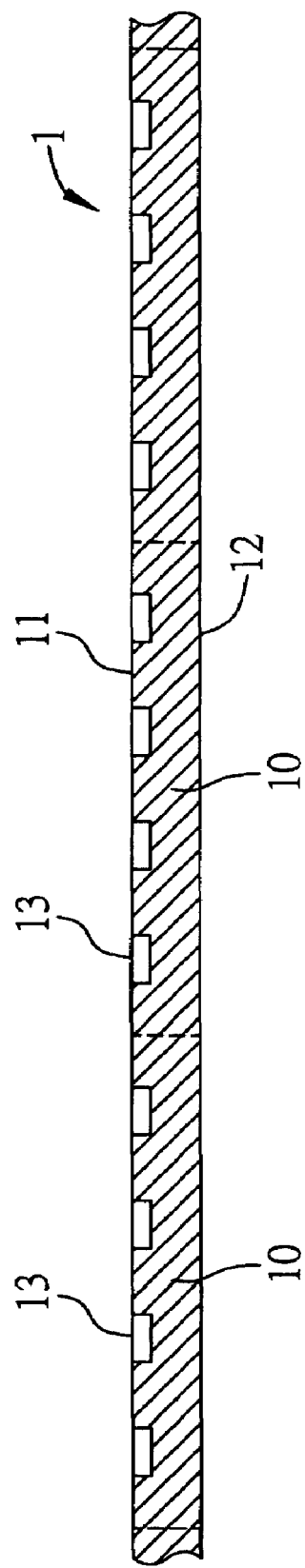
FIGS. 1A to 1D are schematic diagrams showing procedural steps for performing a wafer test method according to the invention.

As shown in FIG. 1A, a wafer test method proposed by the present invention is first to prepare a wafer 1 integrally formed of a plurality of chips 10, wherein each of the chips 10 has an active surface 11 and an opposite inactive surface 12, and a plurality of bond pads 13 are formed on the active surface 11 of each chip 10. The wafer 1 is fabricated by conventional technology, thereby not further detailed herein.

Figure 1B:
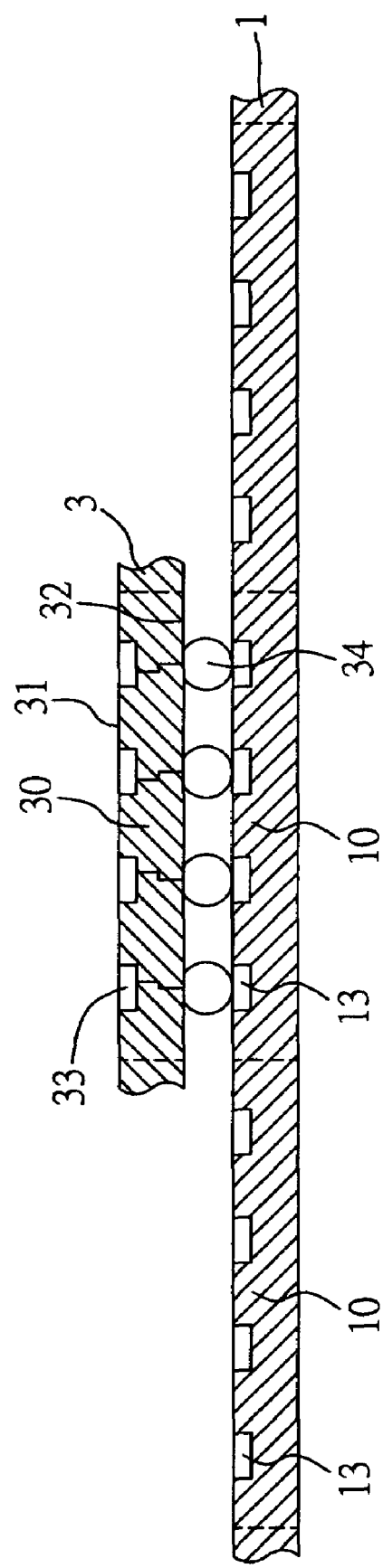

Referring to FIG. 1B, the next step is to mount a conductive interposer 3 on the wafer 1 and electrically connect the conductive interposer 3 to the chips 10. The conductive interposer 3 has a first surface 31 and an opposite second surface 32, wherein the first surface 31 is formed with a plurality of test pads 33 thereon, and the second surface 32 is formed with a plurality of test bumps 34 electrically connected to the test pads 33, the test bumps 34 corresponding to the bond pads 13 of the chips 10 (one is shown), such that the test bumps 34 are in electrical contact with the bond pads 13 to electrically connect the conductive interposer 3 to the chips 10.

Figure 1C:
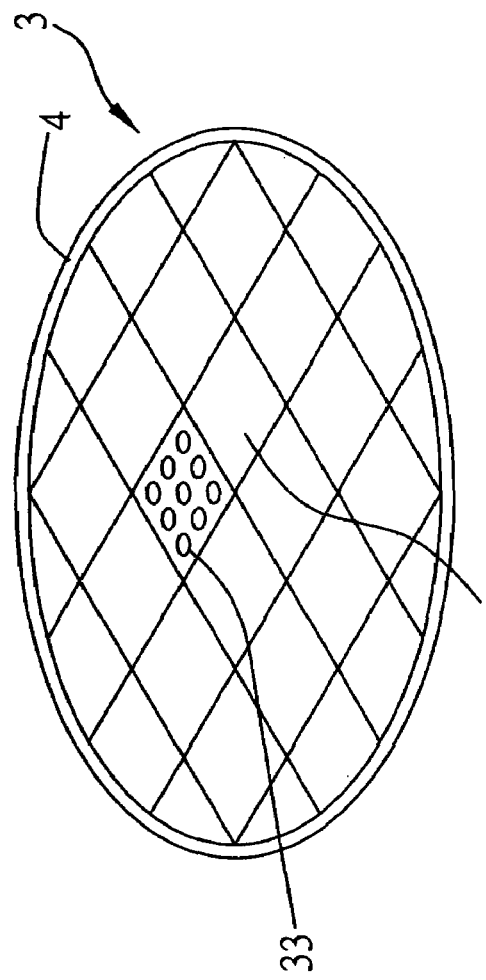

Referring to FIG. 1C, the conductive interposer 3 is composed of a plurality of interposer units 30, and edges of the conductive interposer 3 are supported by a frame 4 that abuts against the wafer (not shown) to position the conductive interposer 3 on the wafer.

Figure 1D:
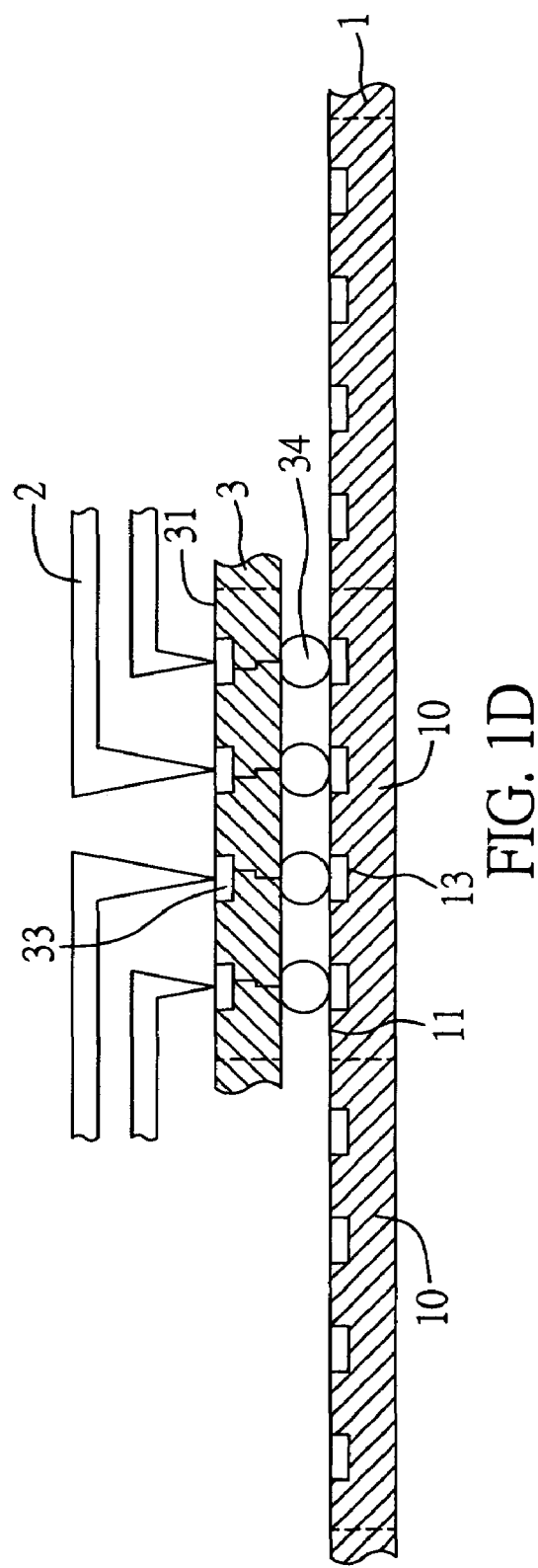

Finally, referring to FIG. 1D, when the conductive interposer 3 is electrically connected to the chips 10, the chips 10 are readily subject to electrical tests. Test probes 2 used to contact the test pads 33 on the first surface 31 of the conductive interposer 3. As the test bumps 34 are in electrical contact with the bond pads 11 of the chips 10, the electrical tests can be performed by the test probes 2 contacting the test pads 33 to examine the quality and functionality of the chips, such that failed chips with defective quality or functions can be collected and discarded, only allowing good chips passing the tests to undergo subsequent fabrication processes.

The above conductive interposer 3 can be fabricated by the processes shown in FIGS. 2A to 2D.

Figure 2A:
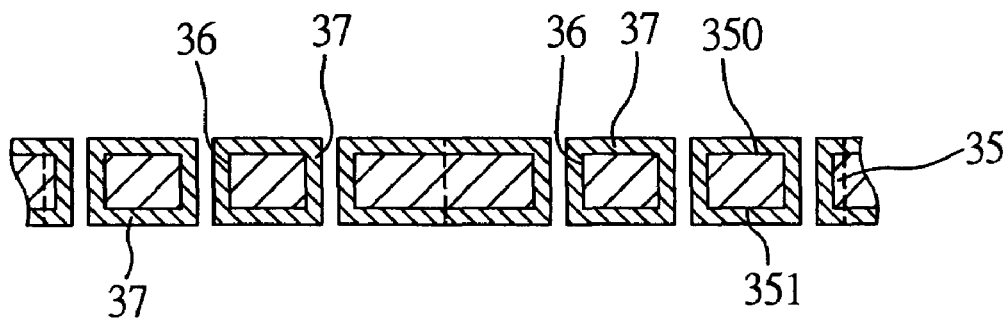
FIGS. 2A to 2D are schematic diagrams showing procedural steps for fabricating a conductive interposer used in the wafer test method according to the invention.

As shown in FIG. 2A, it is first to prepare a core 35, which is a thin film or a substrate made of an organic material such as epoxy resin, polyimide resin, BT (bismaleimide triazine) resin, or FR4 resin. A copper foil (not shown) may be respectively pre-deposited on a first surface 350 and a second surface 351 of the core 35.

Then, a plurality of vias 36 are formed through the core 35. Conventional electroless plating and electrolytic plating processes are in turn performed to deposit a copper layer 37 respectively on the first and second surface 350, 351 of the core 35 and on walls of the vias 36, allowing the vias 36 plated with the copper layer 37 to form conductive vias 36 (designated by the same reference numeral as the vias 36). The first surface 350 of the core 35 corresponds to the first surface 31 of the conductive interposer 3, and the second surface 351 of the core 35 corresponds to the second surface 32 of the conductive interposer 3.

Figure 2B:
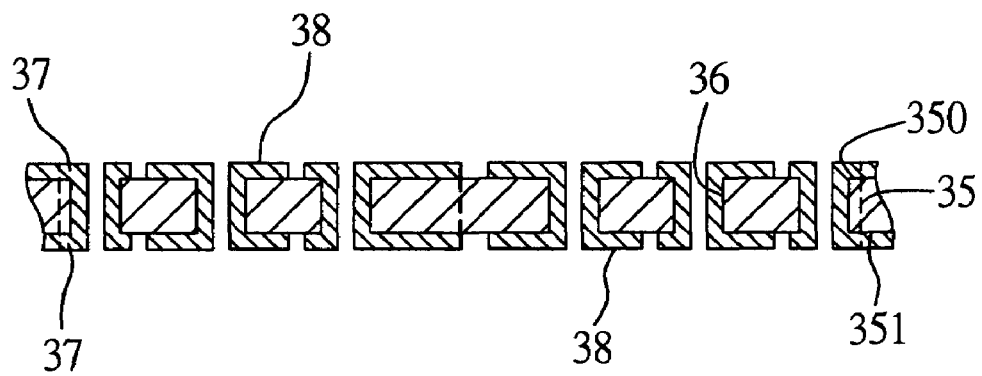

Referring to FIG. 2B, a conventional patterning process is performed to subject the copper layer 37 on the first and second surfaces 350, 351 of the core 35 to form a plurality of conductive traces 38 and allow the conductive traces 38 on the first and second surfaces 350, 351 of the core 35 to be electrically interconnected by the conductive vias 36.

Figure 2C:
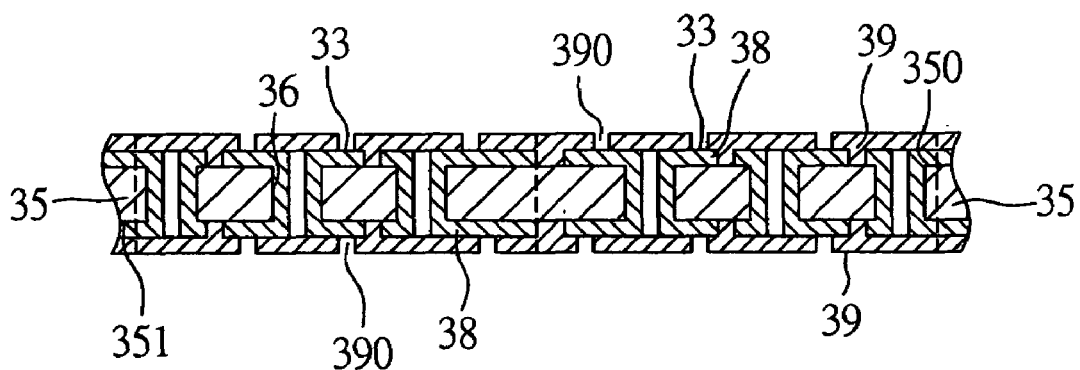

Then, referring to FIG. 2C, a solder mask 39 such as resist dry film is applied respectively over the conductive traces 38 on the first and second surfaces 350, 351 of the core 35. A plurality of openings 390 are formed through the solder mask 39 for exposing predetermined portions of the conductive traces 38 via the openings 390. The exposed portions of the conductive traces 38 on the first surface 350 of the core 35 form test pads 33, and the exposed portions of the conductive traces 38 on the second surface 351 of the core 35 subsequently form test bumps (not shown).

Figure 2D:
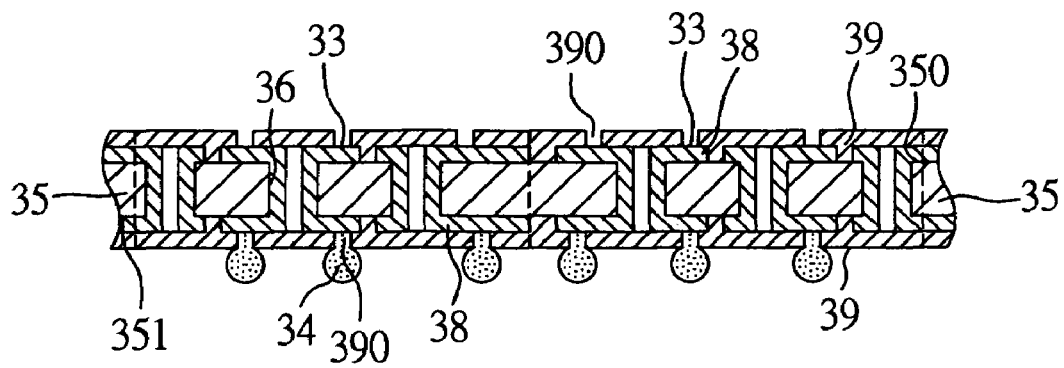

Finally, referring to FIG. 2D, a plurality of test bumps 34 such as gold bumps are formed at the exposed portions of the conductive traces 38 on the second surface 351 of the core 35, so as to allow the test bumps 34 to be electrically connected to the test pads 33 through the corresponding conductive traces 38 and conductive vias 36.

Therefore, the wafer test method according to the invention is carried out for a fabricated wafer prior to forming bumps on the wafer, using a conductive interposer having one side with test pads and the other side with test bumps electrically connected to the test pads. The conductive interposer is mounted on the wafer comprising a plurality of chips, wherein the test bumps are in electrical contact with bond pads formed on active surfaces of the chips. Then, test probes are used to contact the test pads to perform tests for the chips. This wafer test method is beneficially performed prior to forming bumps on the wafer, such that the prior-art drawback of damaging bumps on the wafer by contacting test probes with the bumps on the wafer can be eliminated, and the conductive interposer mounted on the wafer prevents the test probes from physical contact with the bond pads on the chips, thereby not causing damage to the bond pads. Moreover, compared to the prior art using test probes to directly contact bond pads on the wafer, the use of the conductive interposer according to the invention allows moderate contact and increase in contact area between the conductive interposer and the bond pads on the wafer, such that the wafer tests can be more accurately and precisely performed. In addition, compared to using an expensive anisotropic conductive film (ACF) having high resistance and short contact lifetime, the conductive interposer according to the invention is more cost-effectively fabricated and can be used repeatedly, thereby reducing the overall fabrication costs.

Figure 3:
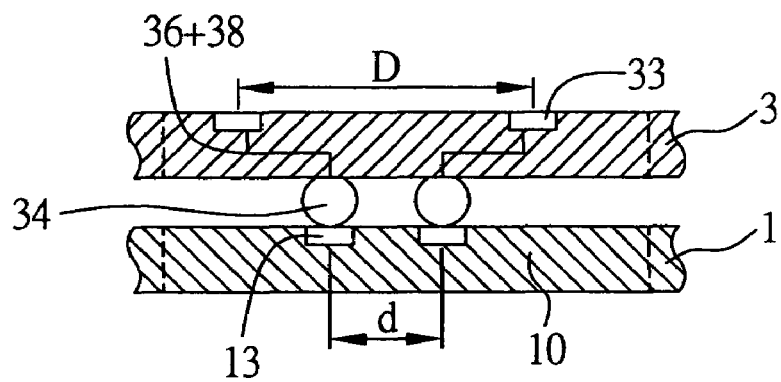
FIG. 3 is a cross-sectional view of the conductive interposer according to another example of the invention.

FIG. 3 shows another example of the conductive interposer 3. This conductive interposer 3 mounted on the wafer 1 allows the bond pads 13 on the chip 10 to be redistributed to alter or increase their pitch d. In particular, when the bond pads 13 on the chip 10 are arranged in high density i.e. having a small pitch d, test probes (not shown) having a corresponding small pitch are required to perform the wafer tests. However, the small-pitch test probes (currently down to a pitch of about 30 μm) are very expensively made, not favorable for reduction of fabrication costs. This problem can be solved by using the conductive interposer 3 having one side with test pads 33 and the other side with test bumps 34, wherein the test bumps 34 are electrically connected to the test pads 33 by conductive traces 38 and conductive vias 36. As a result, the redistribution technique can be performed through the conductive traces 38 and conductive vias 36 to alter or increase the pitch D for the test pads 33, such that test probes can easily and accurately recognize and contact the test pads 33 to perform the wafer tests, thereby not having to concern the pitch limitation of test probes and undesirable increase in fabrication costs.

Figure 4:
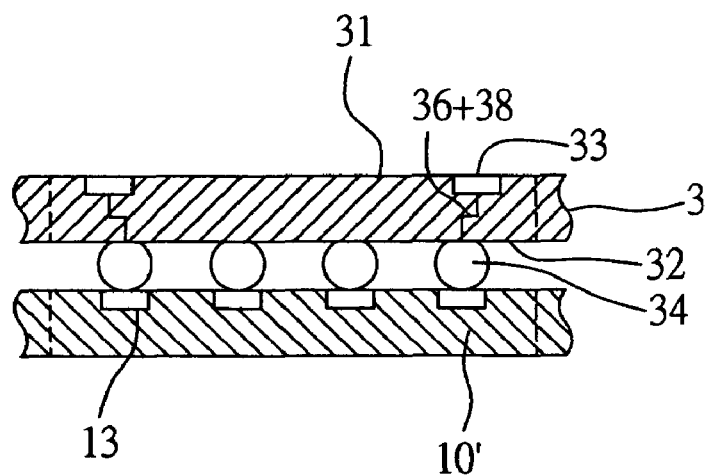
FIG. 4 is a cross-sectional view of the conductive interposer according to a further example of the invention.
Figure 5:
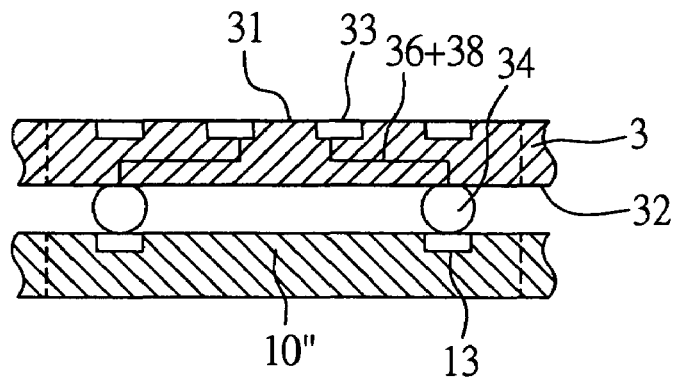
FIG. 5 is a cross-sectional view of the conductive interposer according to a further example of the invention.
Figure 6A:
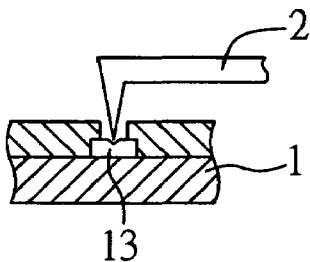
FIGS. 6A to 6C (PRIOR ART) are schematic diagrams showing procedural steps for performing a conventional wafer test method.
Figure 6B:
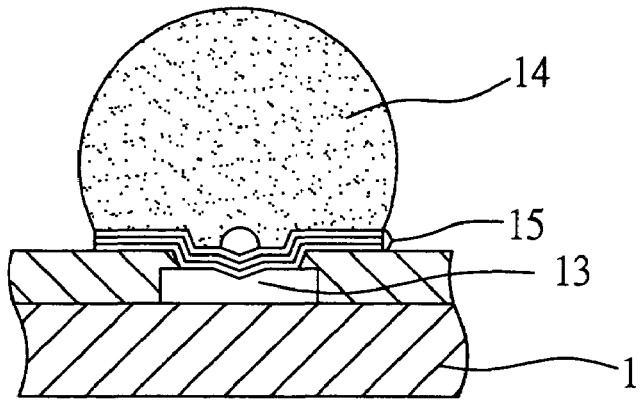
Figure 6C:
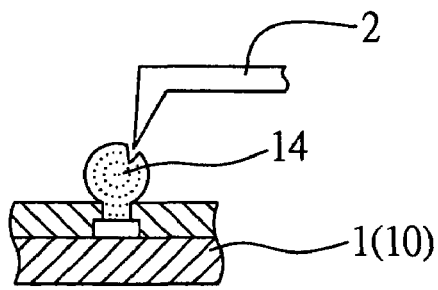

The above conductive interposer 3 adapted to alter the pitch of bond pads 13 by redistribution is also suitable for allowing the use of test probes (not shown) for testing peripheral pads to perform tests for a chip 10' having an array of bond pads 13, as shown in FIG. 4, or the use of test probes (not shown) for testing array-arranged pads to perform tests for a chip 10'' having peripheral bond pads, as shown in FIG. 5. Referring to FIG. 4, the test bumps 34 on the second surface 32 of the conductive interposer 3 correspond to and contact the array-arranged bond pads 13 on the chip 10', and are redistributed to peripheral test pads 33 on the first surface 31 of the conductive interposer 3 by corresponding conductive traces 38 and conductive vias 36, such that the test probes for testing peripheral pads can be used to perform tests for the chip 10'. Similarly, referring to FIG. 5, the peripheral bond pads 13 on the chip 10'' are in contact with peripheral test bumps 34 on the second surface 32 of the conductive interposer 3, and the test bumps 34 are redistributed to array-arranged test pads 33 on the first surface 31 of the conductive interposer 3 by corresponding conductive traces 38 and conductive vias 36, such that the test probes for testing array-arranged pads can be used to perform tests for the chip 10''.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A wafer test method, comprising the steps of:
providing a wafer integrally formed of a plurality of chips, each of the chips having an active surface and an opposite inactive surface, with a plurality of bond pads formed on the active surface;
preparing a conductive interposer composed of a plurality of interposer units each corresponding to one of the chips, each of the interposer units having a first surface and an opposite second surface, wherein the first surface of each of the interposer units is formed with a solder mask having a plurality of openings and a plurality of test pads exposed via the openings of the solder mask, and the second surface of each of the interposer units is formed with a plurality of test bumps electrically connected to the test pads, the test bumps corresponding to the bond pads of the chips, and mounting the conductive interposer on the wafer such that the test bumps are in electrical contact with the bond pads to electrically connect the conductive interposer to the chips; and
using test probes to contact the test pads of the conductive interposer to perform tests for the chips of the wafer.

2. The wafer test method of claim 1, wherein edges of the conductive interposer are supported by a frame that abuts against the wafer to position the conductive interposer on the wafer.

3. The wafer test method of claim 1, wherein the conductive interposer comprises a core having the first surface and the second surface, a plurality of conductive traces formed on the first surface and the second surface of the core, and a plurality of conductive vias penetrating the core for electrically connecting the conductive traces on the first and second surfaces of the core.

4. The wafer test method of claim 3, wherein the core is a thin film.

5. The wafer test method of claim 3, wherein the core is a substrate made of an organic material.

6. The wafer test method of claim 5, wherein the organic material is selected from the group consisting of epoxy resin, polyimide resin, BT (bismaleimide triazine) resin, and FR4 resin.

7. The wafer test method of claim 3, wherein the conductive traces are made of copper.

8. The wafer test method of claim 3, wherein the conductive viWas are formed by plating copper in a plurality of through holes penetrating the core.

9. The wafer test method of claim 3, wherein the solder mask is applied over the first surface of the core and formed with the plurality of openings for exposing predetermined portions of the conductive traces, and the exposed portions serve as the test pads.

10. The wafer test method of claim 9, wherein a solder mask is applied over the second surface of the core and formed with a plurality of openings for exposing predetermined portions of the conductive traces, allowing the test bumps to be bonded to the exposed portions.

11. The wafer test method of claim 10, wherein the test bumps are electrically connected to the test pads by the corresponding conductive traces and conductive vias.

12. The wafer test method of claim 10, wherein the test bumps are electrically connected and redistributed to the test pads by the corresponding conductive traces and conductive vias.

13. The wafer test method of claim 1, wherein the test bumps are made of gold.

* * * * *